(12) United States Patent
Miller et al.

(10) Patent No.: US 7,827,336 B2
(45) Date of Patent: Nov. 2, 2010

(54) TECHNIQUE FOR INTERCONNECTING INTEGRATED CIRCUITS

(75) Inventors: Gary L. Miller, Austin, TX (US); Ronald W. Stence, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 148 days.

(21) Appl. No.: 12/267,725

(22) Filed: Nov. 10, 2008

(65) Prior Publication Data

US 2010/0122001 A1 May 13, 2010

(51) Int. Cl.
*G06F 13/00* (2006.01)
(52) U.S. Cl. .................................. 710/110; 710/306
(58) Field of Classification Search ......... 710/104–119, 710/306–317
See application file for complete search history.

(56) References Cited

U.S. PATENT DOCUMENTS

| | | | |
|---|---|---|---|
| 5,805,865 | A | 9/1998 | Mimura et al. |
| 6,397,354 | B1 | 5/2002 | Ertekin |
| 6,717,276 | B2 | 4/2004 | Walter et al. |
| 6,845,027 | B2 | 1/2005 | Mayer et al. |
| 6,877,114 | B2 | 4/2005 | Allen et al. |
| 7,279,795 | B2 | 10/2007 | Periaman et al. |
| 7,288,434 | B2 | 10/2007 | Karnezos |
| 2003/0052712 | A1 | 3/2003 | Comer |
| 2003/0209740 | A1 | 11/2003 | Miyamoto et al. |
| 2005/0017341 | A1 | 1/2005 | Egerer |
| 2006/0061953 | A1 | 3/2006 | Le |

OTHER PUBLICATIONS

U.S. Appl. No. 12/026,325, filed with the USPTO Feb. 5, 2008, listing Perry H. Pelley, III as the first named inventor.
PCT Search Report and Written Opinion, PCT/US2009/062469, Mailed Date Jun. 1, 2010.

*Primary Examiner*—Raymond N Phan
(74) *Attorney, Agent, or Firm*—James L. Clingan, Jr.; David G. Dolezal

(57) ABSTRACT

Two integrated circuit die each having a processing core and on-board memory are interconnected and packaged together to form a multi-chip module. The first die is considered primary and the second die is considered secondary are connected through an interposer. The first and second die may be the same design and thus have the same resources such as peripherals and memory and preferably have a common system interconnect protocol. The core of the second die is disabled or at least placed in a reduced power mode. The first die includes minimal circuit for interconnecting to the second die. The second die has some required interface circuitry and an address translator. The result is that the core of the first die can perform transactions with the memory and other resources of the second integrated circuit as if the memory and other resources were on the first die.

20 Claims, 7 Drawing Sheets

US 7,827,336 B2

TECHNIQUE FOR INTERCONNECTING INTEGRATED CIRCUITS

RELATED APPLICATION

This application is related to U.S. application Ser. No. 12/267,728 titled "Technique for Packaging Multiple integrated circuits," by Gary L. Miller and Michael B. McShane," filed on even date herewith, and assigned to the assignee hereof.

BACKGROUND

1. Field

This application relates to integrated circuits, and more particularly to interconnecting integrated circuits.

2. Related Art

There have been many reasons for interconnecting more than one integrated circuit die to form a single packaged device. One use has been to increase memory for a given package. Another has been to combine two die that are commonly used together but are difficult to make using a process that is effective for both. One example is a logic circuit and an RF circuit used for mobile phones. Sometimes there are interconnect issues or interference issues that must be addressed. In any case there are sometimes issues that are addressed because of the particular combination of die being implemented. Regardless of the reason for the combination of the multiple die, there are issues that arise in order to overcome the fact that there is a need to have multiple die. The ability to combine various functionalities on a single die remains limited so the issues associated with multiple die continue.

Accordingly there is a need for improved techniques for interconnecting multiple die.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, two integrated circuit die each having a processing core and on-board memory are interconnected and packaged together to form a multi-chip module. The first die is considered primary and the second die is considered secondary. They are connected together through an intermediate substrate. The first and second die may be the same design and thus have the same resources such as peripherals and memory and preferably have a common system interconnect protocol. The core of the second die is disabled during most of the operation or at least placed in a reduced power mode as needed. The first die includes minimal circuitry for interconnecting to the second die. The second die has at least some required interface circuitry and an address translator. The result is that the core of the first die can perform transactions with the memory and other resources of the second integrated circuit as if the memory and other resources were on the first die. This is particularly beneficial for use as a prototype. The various features that are ultimately considered desirable from experimenting with the prototype can easily be included into a single die used in high volume production. Thus optimizing the features for production is more likely and more timely by being able to wait until after experiments with the prototype have been performed before finalizing the design of the production device. This can be beneficial for early software development and product prototyping. This is better understood with reference to the drawings and the following description.

Figure 1:
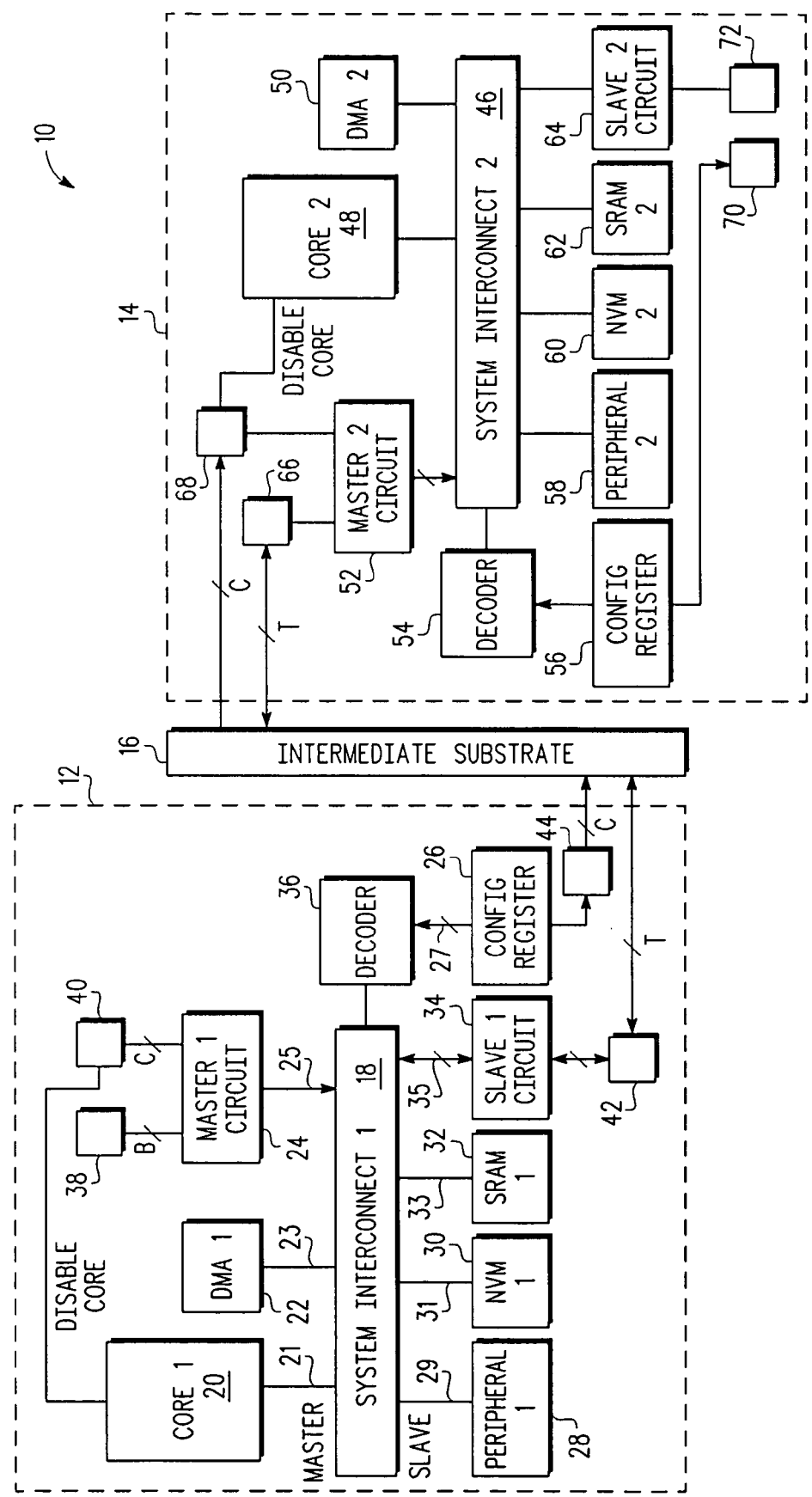
FIG. 1 is a block diagram of a multiple die device according to an embodiment.

Shown in FIG. 1 is a packaged device 10 comprising an integrated circuit die 12, an integrated circuit die 14, and an intermediate substrate 16. Integrated circuit 12 comprises a system interconnect 18, a core 20, a DMA 22, a master circuit 24, a configuration register 26, a peripheral 28, a non-volatile memory (NVM) 30, a static random access memory (SRAM) 32, a slave circuit 34, a decoder 36, an external terminal 38, an external terminal 40, an external terminal 42, and an external terminal 44. Integrated circuit 14 comprises a system interconnect 46, a core 48, a DMA 50, a master circuit 52, a decoder 54, a configuration register 56, a peripheral 58, an NVM 60, an SRAM 62, a slave circuit 64, an external terminal 66, an external terminal 68, an external terminal 70, and an external terminal 72. In this example integrated circuit die 12 and 14 are the same design. Although it is not essential that they be the same, it is preferable that system interconnects 18 and 46 be of the same protocol. One example of such a system interconnect is the crossbar system interconnect. The crossbar system is a good example because adding resources to such a system is achieved relatively easily. Cores 20 and 48 function as processing units and are connected to system interconnects 18 and 46, respectively. In this example, die 12 is the primary die functioning as a master and die 14 is the secondary die functioning as a slave. Peripherals 28 and 58 may be a wide variety of functional circuits. One example is an analog to digital converter. The external terminals are for directly connecting externally to the die of which they are a part.

With regard to die 12, system interconnect 18 is connected to core 20 at a master port 21 of system interconnect 18, to DMA 22 at a master port 23 of system interconnect 18, to master circuit 24 at a master port 25 of system interconnect 18, to configuration register 26 at a master port 27 of system interconnect 18, to peripheral 28 at a slave port 29 of system interconnect 18, to NVM 30 at a slave port 31 of system interconnect 18, to SRAM 32 at a slave port 33 of system interconnect 18, and to slave circuit 34 at a slave port 35 of system interconnect 18. Master circuit 52 is connected to external terminals 66 and 68 which in this example are not connected externally to die 12. Configuration register 26 is shown connected directly to decoder 36 for clarity of function but is actually connected to decoder 36 through system interconnect 18. External terminal 42 is connected to slave circuit 34 and to intermediate substrate 16. External terminal 44 is connected to configuration register 26 and intermediate substrate 16. Slave circuit 34 is for connecting to the secondary die. Master circuit 24 is connected to core 20. Intermediate substrate 16 is for connecting die 12 and 14 together both electrically and structurally. The resources connected to what is shown as the upper portion of system interconnect 18 are connected to master ports and those resources on the lower portion of system interconnect 18 are connected to slave ports. Thus, core 20, DMA 22, and master circuit 24 are communicatively coupled to system interconnect 18 at master ports. Peripheral 28, NVM 30, SRAM 32, slave circuit 34, and configuration register 26 are communicatively coupled to system interconnect 18 at slave ports. Having a microcontroller with a system interconnect divided having slave ports and master ports is well known in the art.

With regard to die 14, system interconnect 46 is connected to core 48, DMA 50, master circuit 52, decoder 54, configuration register 56, peripheral 58, NVM 60, SRAM 62, slave circuit 64. Master circuit 52 is connected to external terminals 66 and 68. External terminals 66 and 68 are connected to intermediate substrate 16. Decoder 54 is shown being directly connected to configuration register 56 for clarity of function but is actually connected to configuration register 56 through system interconnect 46. Configuration register 56 is connected to external terminal 70. Slave circuit 64 is connected to external terminal 72. External terminals 70 and 72 are not connected to circuitry external to die 14. Slave circuit 34 and configuration register 26 being connected to master circuit 52 through intermediate substrate 16 establish die 12 as the primary and die 14 as the secondary. Core 48, DMA 50, master circuit 52 are communicatively coupled to system interconnect 18 at master ports. Peripheral 58, NVM 60, SRAM 62, slave circuit 64, and configuration register 56 are communicatively coupled to system interconnect 18 at slave ports.

In operation, core 20 can access resources connected to system interconnect 18 as well as peripheral 58, NVM 60, and SRAM 62 connected to system interconnect 46. Decoder 36 decodes the system interconnect to load configuration register with the control information that external terminal 44 will provide information that die 12 is the primary. This is received by external terminal 68 and thus master circuit 52 as a configuration signal C through intermediate substrate 16. Master circuit 52 is for receiving transaction requests from the primary die acting as the master. Slave circuit 34 controls transactions T with master circuit 52 through intermediate substrate 16 and external terminal 66. For example, if core 20 chooses to access SRAM 62, this is communicated to slave circuit 34 through system interconnect 18. Slave circuit communicates the transaction T to master circuit 52. Master circuit 52 then performs the transaction regarding SRAM 62 through system interconnect 46. The transaction is communicated back from master circuit 52 to slave circuit 34 and from slave circuit 34 to core 20 using system interconnect 18. This is further explained with reference to FIG. 2.

Figure 2:
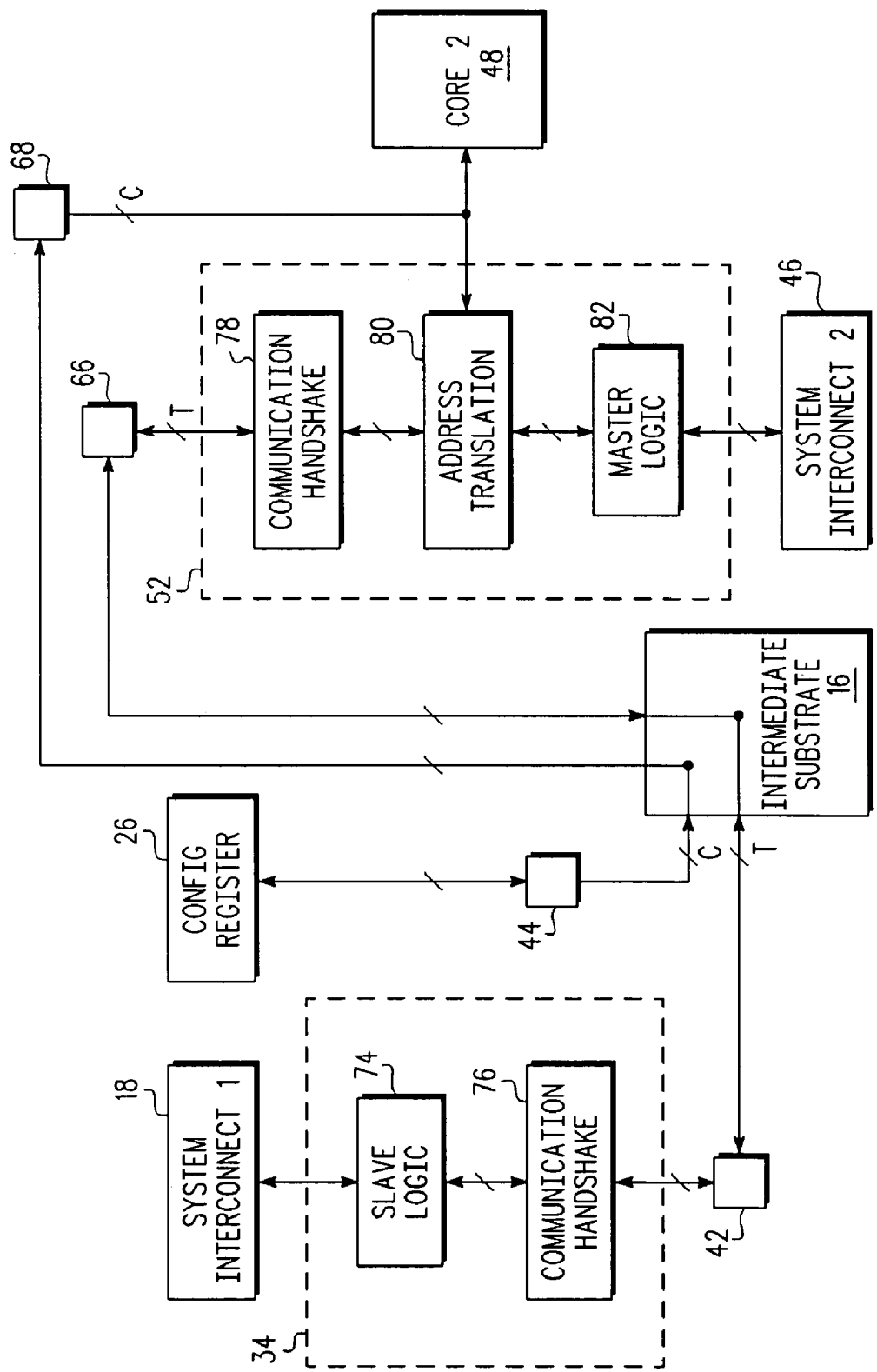
FIG. 2 is a block diagram showing more detail of a portion of the device of FIG. 1.

Shown in FIG. 2 is a portion of device 10 in more detail. Shown in FIG. 2 and also shown in FIG. 1 are system interconnect 18, slave circuit 34, configuration register 26, intermediate substrate 16, master circuit 52, system interconnect 46, core 48, and external terminals 42, 44, 66, and 68. Slave circuit 34 comprises slave logic 74 and a communication handshake circuit 76. Slave logic 74 is connected to system interconnect 18 through a first interface and to communication handshake circuit 76 through a second interface. Master circuit 52 comprises a communication handshake circuit 78, an address translation circuit 80, and master logic 82. Communication handshake circuit 78 is connected to external terminal 66 through a first interface and to address translation circuit 80 through a second interface. Master logic 82 is connected to address translation circuit 80 through a first interface and to system interconnect through a second interface. Address translation circuit and core 48 are connected to configuration register 26 through external terminals 68 and 44. Slave logic 74 interfaces with system interconnect 18 in order to know what transactions to perform with die 14 and couples the necessary information such as addresses and data when a transaction is being performed. Communication handshake circuit 76 communicates with communication handshake circuit 78 so that signals between them are timely and synchronized.

Figure 3:
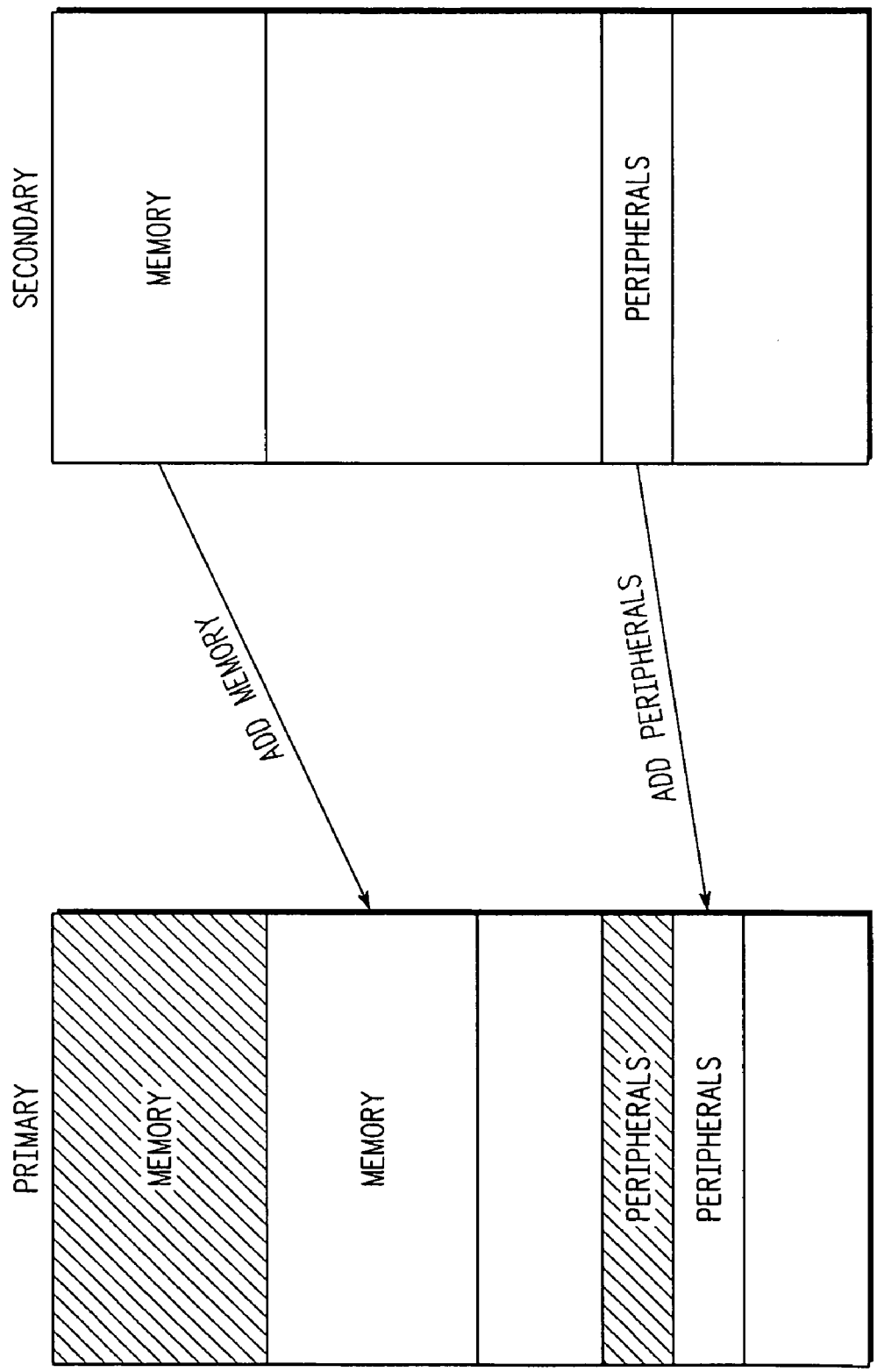
FIG. 3 shows address mapping relevant to the operation of the multiple die device.

Core 20 has access to the resources connected to system interconnect 46 and thus has doubled the resources at its disposal. In the case of adding memory such as NVM 60 and SRAM 62, integrated circuit 12 must also be able to add corresponding address space compared to what is required for just using the memory connected to system interconnect 18. This is rarely a problem because the amount of system memory onboard a microcontroller is far less than the addressing capability of the core. Core 20 would be expected to have addressing capability of at least 32 bits and perhaps 64 or even 128. Even with the low addressing capability of only 32 bits, the number of memory locations being able to be addressed is in excess of 4 billion. If there was a byte in each location that would be a capability of addressing in excess of 4 gigabytes of memory. At the same time, however, the address space for the memory in integrated circuit 14 is the same as that for integrated circuit 12. Thus, in order to treat the memory of integrated circuit 14 as additional memory, there must be an address translation when core 20 is addressing the memory of integrated circuit 14. This is shown in FIG. 3. Thus the primary memory, which is the memory in the primary microcontroller that is integrated circuit 12 in this example, occupies a first address range within an address map and the secondary memory, which is the memory in the secondary microcontroller that is integrated circuit 14 in this example, occupies a second address range within the address map. As shown in FIG. 3, this same methodology applies to using the peripherals as well. In the case where a resource of integrated circuit 14 is treated as duplicate resource to that of integrated circuit 12, then no translation is required.

When a resource on the secondary die, such as SRAM 62, is treated as a duplicate resource, it replaces the identical resource SRAM 32 on the primary die. In operation, core 20 would access the address space associated with SRAM 32 across system interconnect 18, yet the access would be diverted to SRAM 62 via slave 1 circuit 34, intermediate substrate 16, master 2 circuit 52, and system interconnect 46. In this operation no address translation is required, however, the address decoding logic associated with SRAM 32 is disabled.

For an operational example, if an address for a write is to be communicated ultimately to SRAM 62, then communication handshake circuit 78 must be ready to receive it. Address translation 80, under the control of configuration register 26, performs necessary translations. In this example of die 12 and die 14 being the same design, the memory space allocated by decoder 36 for the memory, such as NVM 60 or SRAM 62, of die 14 is different than that recognized by die 14. Thus a translation is required. Configuration register 26 thus communicates what translation is needed. Address translation circuit 80 thus performs the translation that is commanded by configuration register 26. Master logic 82 receives the translated address from address translation circuit 80 and negotiates with system interconnect 46 to perform the commanded transaction. Core 48 is placed into a lower power mode under the command of configuration register 26. Core 48 may be active during start-up, but after start-up has been completed, core 48 may be powered down to save power. In this example, translation is performed by the secondary die, but the translation could instead be performed by the primary die. As shown in FIG. 2, address translation circuit 80 could be moved between slave logic 74 and communication handshake 76.

In case of die 14 providing information back to die 12, master logic 82 receives the information from system interconnect 46 and couples the information to address translation circuit 80. Address translation circuit 80 performs any needed translation under the command of configuration register 26. Communication handshake circuit coordinates with handshake circuit 76 to properly communicate the information to logic 74. Logic 74 then negotiates with system interconnect to get the information through system interconnect to core 20.

This operation allows for core 20 to use resources of die 14 that are connected to system interconnect 46. Thus, a variety of experiments may be run to determine the optimum combination of resources for a next generation of integrated circuits. Because the experiments are being run with existing integrated circuits from which there is already, and probably improving, manufacturing capability, the time to market for an integrated circuit with a new combination of such resources is expected to be short.

Figure 4:
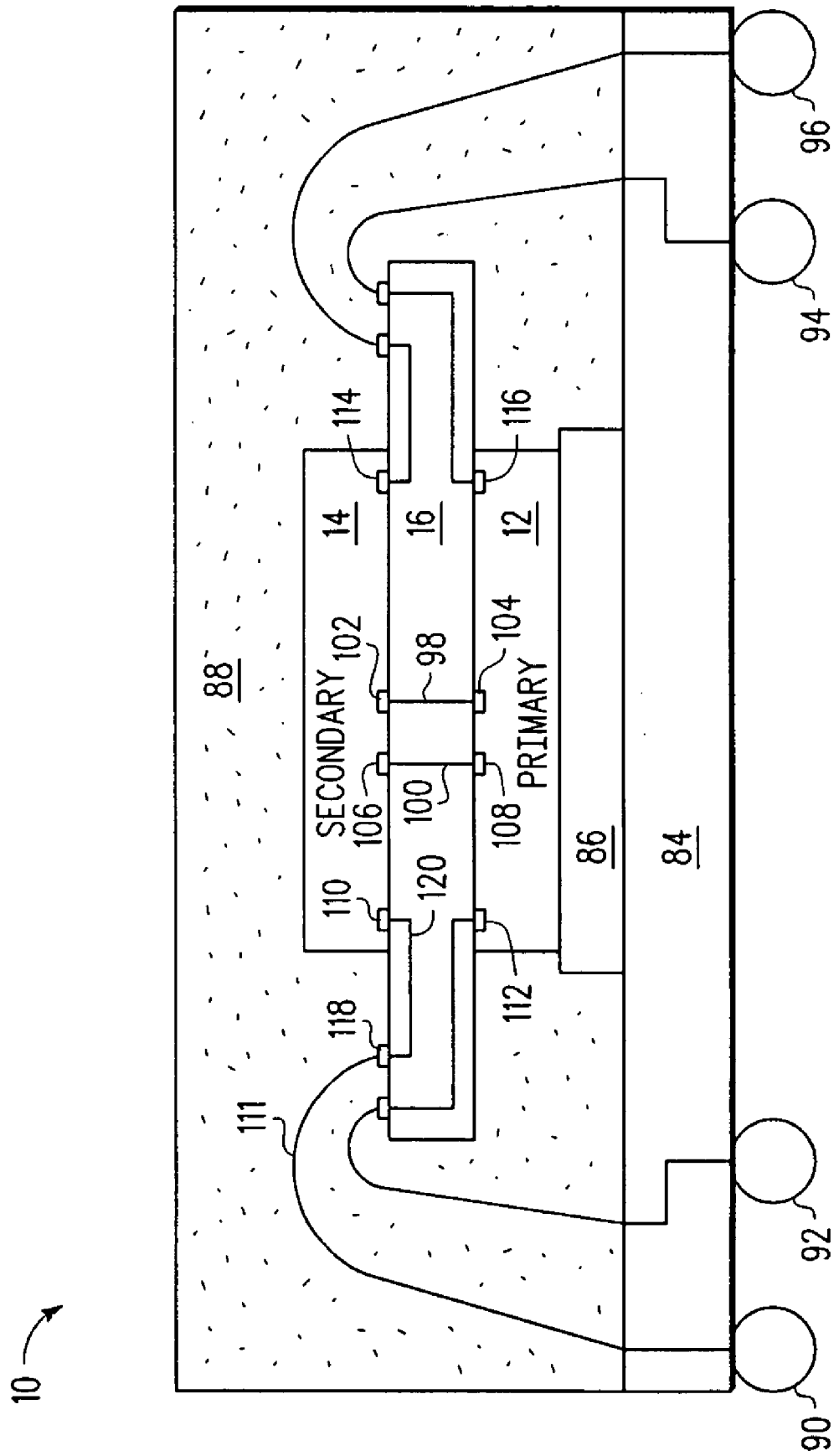
FIG. 4 is a cross section of the device according to a first packaging embodiment.

Shown in FIG. 4 is a completed device 10 in pictorial form as a cross section showing die 12 and die 14 coupled to each other through intermediate substrate 16 and encapsulated with an encapsulant such as a mold compound like epoxy novolac. Representative contacts, which may also be called terminals, are shown for simplicity and ease of understanding, but many more contacts would be present for an actual device. Die terminals may be, for example, solder, gold, or a conductive organic material such as silver filled epoxy or an epoxy sphere coated with a conductor. Also shown is a heat spreader 86 for coupling heat from die 12 to a package substrate 84. Intermediate substrate 16 connects terminals of die 12 and 14 to each other as well as to a top surface of package substrate 84. An example of a die to die connection is a terminal 104 of die 12 connected to a terminal 102 of die 14 through a via 98. Another example is terminal 106 of die 14 connected to terminal 108 of die 12 through a via 100. Vias 98 and 100 may be plated holes through intermediate substrate 16. An example of a connection between die 14 and intermediate substrate 16 is a terminal 110 connected to a pad 118 of intermediate substrate 16 through a conductive line 120. Die 14 similarly has a terminal 114 connected to an intermediate substrate pad of intermediate substrate 16. In the same way, die 12 has connections 112 and 116 connected to pads of intermediate substrate 16. In this example, pads on intermediate substrate 16 that are connected to pads of die 12 or die 14 are connected to package substrate 84 by wire bonding such as by wire bond 111 which connects pad 118 of intermediate substrate 16 to solder ball 90. The wire bond landings are connected to solder balls on the bottom of package substrate 84. Other exemplary solder balls that are on the bottom of package substrate 84 shown in FIG. 4 are solder balls 92, 94, and 96. Intermediate substrate 16 may be made of silicon or some other material such as a ceramic such as aluminum nitride. Heat spreader 86 may be made of a metal such as copper or another type of material with good heat transfer. Good heat transfer and matching the coefficient of thermal expansion are desired objectives for heat spreader 86.

Figure 5:
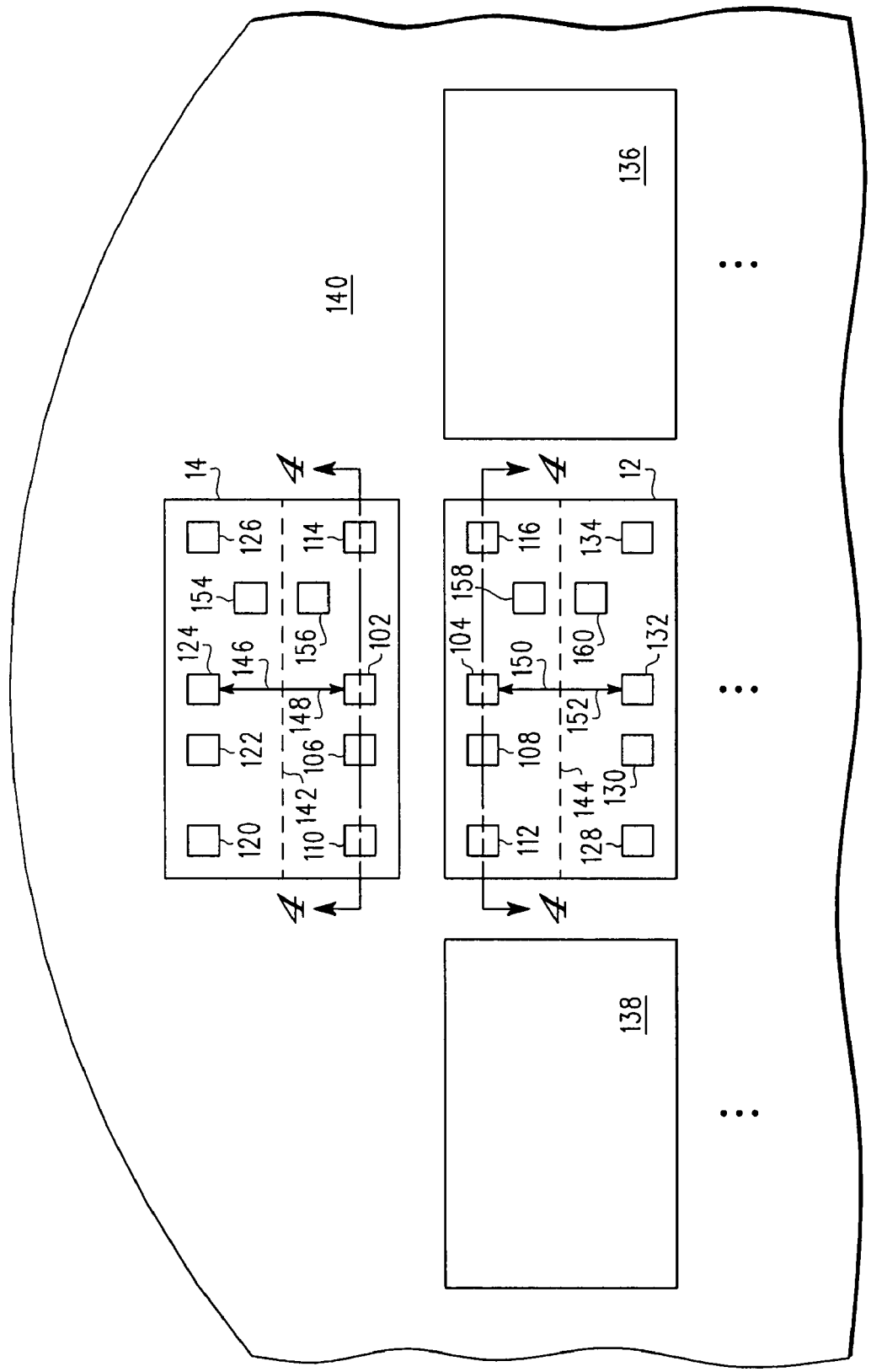
FIG. 5 is a top view of two die useful in making the device of FIG. 4.

Shown in FIG. 5 is a top view of die 12 and 14 and also die 136 and 138 as shown on a wafer 140. Die 12 and 14 are shown having contacts that are arranged so as to be convenient in attaching to intermediate substrate 16 in a desired manner. In this example, die 12 and 14 should be the same but have somewhat different functions. Die 12 functions as the primary or master, and die 14 functions as the secondary or slave. Some contacts are for use when the particular die is primary and others for use when functioning as the slave. Shown on die 14 are contacts 102, 106, 110, 114, 120, 122, 124, 126, 154, and 156. Shown on die 12 are contacts 104, 108, 112, 116, 128, 130, 132, 134, 158, and 160. With the secondary being die 14, contacts associated with it being the secondary include contacts 102, 106, and 154. The unused master contacts are 122, 124, and 156. Master contacts 122, 124, and 156 are symmetric about center line 142 with slave contacts 106, 102, and 154, respectively. For example, a distance 146 from center line 142 to contact 124 is the same as a distance 148 from center line 142 to contact 102. Similarly for die 12, contacts associated with it being a master are contacts 108, 104, and 160. The unused slave contacts associated with die 12 being a master are contacts 130, 132, and 158. Slave contacts 130, 132, and 158 are symmetric about center line 144 with master contacts 108, 104, and 160, respectively. For example, a distance 150 from center line 144 to contact 104 is the same as a distance 152 from center line 144 to contact 132. This symmetry allows for die 12 and 14 to be the same but also to have the slave contacts align to the master contacts and the master contacts align to the slave contacts. This allows for the active regions of die 12 and 14 to face each other while contacting intermediate substrate aligned so that the slave contacts of one die are electrically connected to the master contacts of the other die. Because the die are the same and any one can be either a slave or a master, each other contact also has a corresponding symmetrical contact.

In other applications where the die can be different, the symmetry may not be of concern and the approach shown in FIG. 4 could be used without requiring the symmetry.

Figure 6:
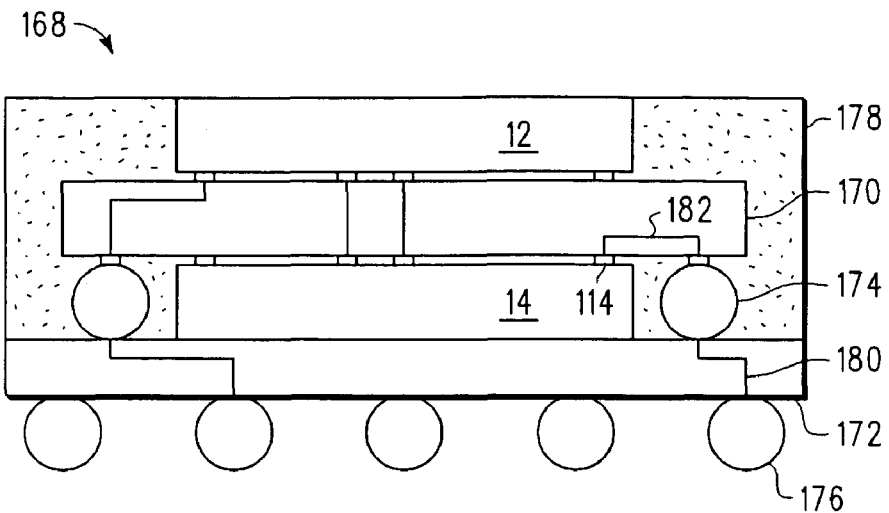
FIG. 6 is a cross section of the device according to a second packaging embodiment.

Shown in FIG. 6 is a completed device 168 as an alternative to completed device 10 of FIG. 4. Device 168 has die 12 and 14 contacting an intermediate substrate 170 in similar fashion to how they contacted intermediate substrate 16 in FIG. 4. Terminal 114 as an exemplary terminal is coupled to an contact of intermediate substrate 170 through a conductor 182. Device 168 differs from device 10 by intermediate substrate 170 contacting a package substrate 172 using solder balls such as solder ball 174 to contact package substrate 172, and by die 12, the primary, being over the die 14. Die 12 has a backside opposite from the active side exposed so that a heat spreader may be applied to it. The primary integrated circuit has the greater need for a heat spreader than the secondary integrated circuit. This also shows solder balls such as solder ball 176 as the external connection of device 168 and that the solder balls may be under the die. An exemplary conductor 180 connects solder ball 174 to solder ball 176 through package substrate 172. Encapsulant 178 covers all but the backside of die 12 and 14 and intermediate substrate 170. This type of package with an array of solder balls is sometimes referenced as a ball grid array (BGA) package. The active sides of die 12 and 14 face intermediate substrate 170 and no wire bonds are required.

Figure 7:
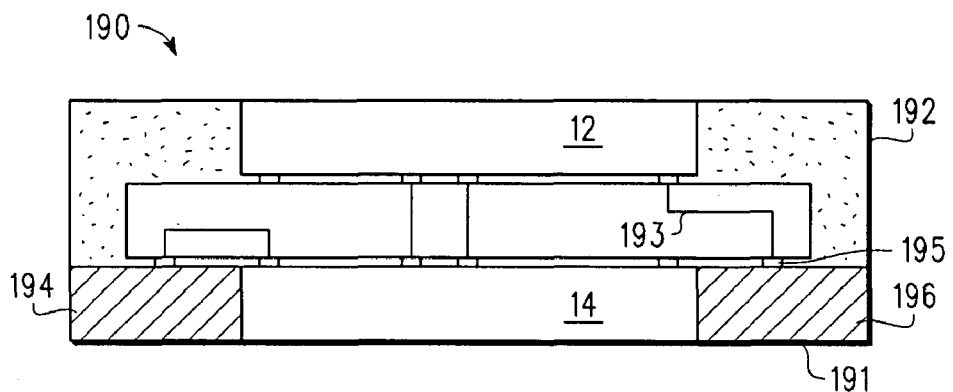
FIG. 7 is a cross section of the device according to a third packaging embodiment.

Shown in FIG. 7 is a completed device 190 as another alternative. Die 12 and 14 are attached to an intermediate substrate with their active sides facing the intermediate substrate as described previously for devices 10 and 168. In this case, a package substrate 191 has an opening in which resides die 14. The package substrate has selected portions, such as conductive portions 194 and 196 that are for providing the electrical contact outside the package. Conductive portions 194 and 196 are an integral part of the structure of package substrate 191 which may be, for example, part of a lead frame of copper, a conductor commonly known as alloy 42, or another lead frame material useful in a lead frame known as quad flat no-lead (QFN) package. Electrical contacts from the intermediate substrate to the conductive portions are through terminals such as terminal 195 similar to the previously described terminals. An exemplary conductor 193 connects die 12 to terminal 195 through the intermediate substrate. Encapsulant 192, in this example, extends only to the top of die 12 so that the backside of die 12 is exposed and a heat spreader may be applied.

Figure 8:
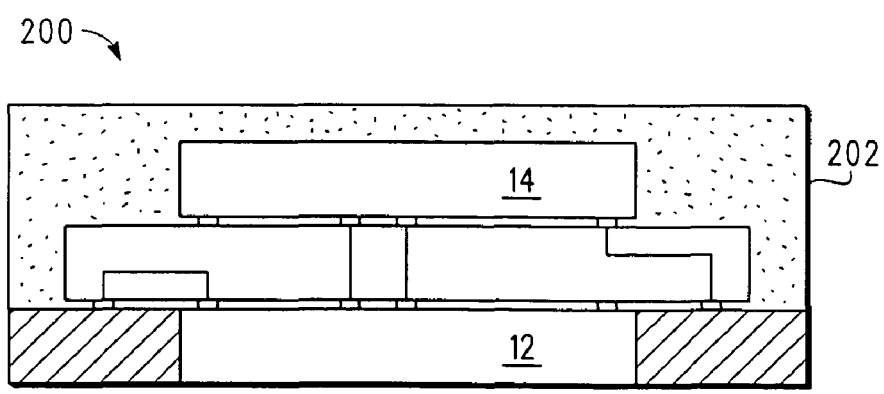
FIG. 8 is a cross section of the device according to a fourth packaging embodiment.

Shown in FIG. 8 is a completed device 200 that is the same as completed device 190 except die 14 is on top and die 12 is on the bottom and an encapsulant 202 covers die 14. In this case, a heat spreader would need to be applied on the bottom side of completed device 200 because that is where die 12 has its backside exposed.

Figure 9:
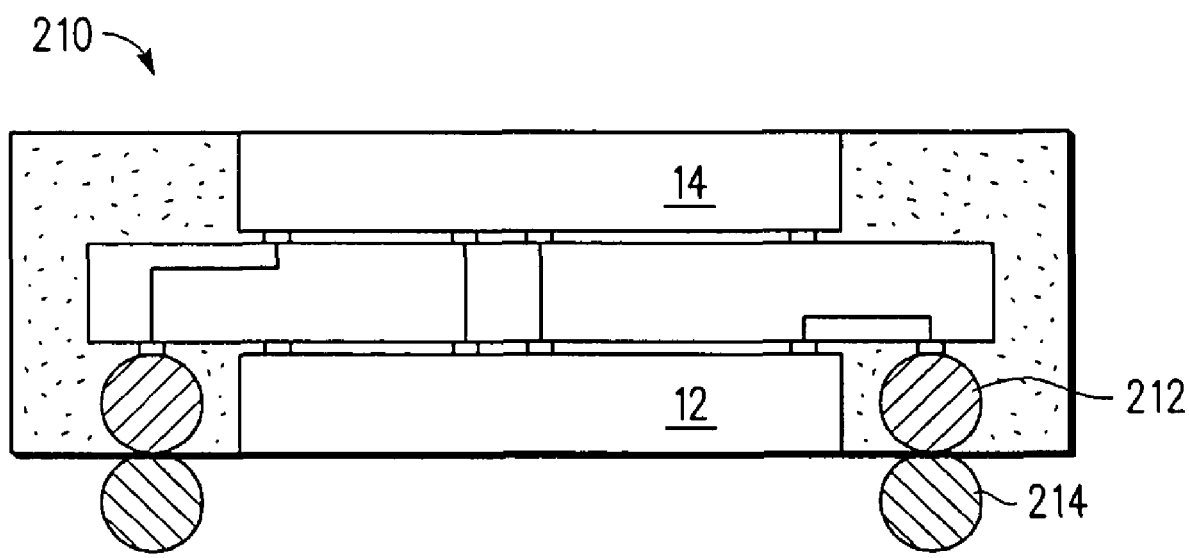
FIG. 9 is a cross section of the device according to a fifth packaging embodiment.

Shown in FIG. 9 is a completed device 210 similar as yet another alternative that has die 12 and 14 attached to an intermediate substrate with their active sides facing the intermediate substrate as described previously for devices 10, 168, 190, and 200. In this case solder balls, such as solder ball 212, are used to provide electrical connection to device 210. Die 12 is shown as being on the bottom so its backside is exposed there for application of a heat spreader. Die 14 has its backside exposed on the top. Die 12 and 14 may be switched so that die 112 would have its backside exposed on the top of device 210. Solder balls, such as solder ball 214, are shown attached to device 210 showing that a BGA can also be made in this fashion.

Thus, a variety of variations for packaging die 12 and 14 are available as shown in FIGS. 4-9. The packaging is particularly beneficial for this situation where the die are the same, but these packages potentially have applicability outside of this particular context. The two die could be very diverse such as a die optimized for RF performance and a die designed for logic. Further the two die could be different sizes.

By now it should be appreciated that there has been provided an information processing system including a first integrated circuit die and a second integrated circuit die. The first integrated circuit die includes a first system interconnect that includes a first plurality of master ports and a first plurality of slave ports and is operable as per a first system interconnect protocol, a first processor core communicatively coupled to a first master port of the first plurality of master ports, a memory communicatively coupled to a first slave port of the first plurality of slave ports, and a first slave circuit communicatively coupled to a second slave port of the first plurality of slave ports. The second integrated circuit die includes a second system interconnect that includes a second plurality of master ports and a second plurality of slave ports and is operable as per the first system interconnect protocol, a second processor core communicatively coupled to a first master port of the second plurality of master ports, an addressable slave circuit communicatively coupled to a first slave port of the second plurality of slave ports, the addressable slave circuit having an addressable range of addresses, the addressable range of addresses corresponding to a first address range within an address map of the first integrated circuit die, the addressable range of addresses corresponding to a second address range within an address map of the second integrated circuit die, and a first master circuit communicatively coupled to a second master port of the second plurality of master ports. The first slave circuit is communicatively coupled to the first master circuit for providing data during a data access to the addressable slave circuit by a system interconnect master of the first integrated circuit die via the first system interconnect and the second system interconnect. The system may be further characterized by at least one of the first slave circuit and the first master circuit including an address translation circuit for translating an address of the addressable slave circuit from the first address range to the second address range. The system may be further characterized by the first master circuit including a translation circuit. The system may further comprise a memory configured to store configuration information that is utilized for controlling the system to operate in one of a plurality of modes wherein, in a first mode of the plurality of modes, data accesses to the addressable slave circuit are made by a system interconnect master of the first system interconnect addressing the first address range and in a second operating mode, data accesses to the addressable slave circuit are made by a system interconnect master of the first system interconnect addressing a third address range of the address map of the first integrated circuit die. The system may be further characterized by the addressable slave circuit is a memory circuit. The system may further comprise a configuration communication path between the first integrated circuit die and the second integrated circuit die, the configuration communication path for providing operating mode information between the first integrated circuit die and the second integrated circuit die. The system may be further characterized by the addressable slave circuit being a memory circuit. The system may be further characterized by the addressable slave circuit being a peripheral circuit. The system may be further characterized by, during at least one mode of operation, the second core being in a low power mode during data accesses to the addressable slave circuit. The system may be further characterized by the first integrated circuit die being a microcontroller and the second integrated circuit die being a microcontroller. The system may be further characterized by the first integrated circuit further comprising a second master circuit communicatively coupled to a second master port of the first plurality of master ports and coupled to external terminals of the first integrated circuit die, wherein the external terminals are configured in a non-useable state, and a second slave circuit communicatively coupled to a second slave port of the second plurality of slave ports and coupled to external terminals of the second integrated circuit die, the external terminals of the second integrated circuit die being configured in a non-useable state, wherein at least one of the second slave circuit and the second master circuit includes an address translation circuit for translating an address. The system may further comprise a memory configured to store configuration information utilized for controlling the system to operate in one of a plurality of modes, wherein, in a first mode of the plurality of modes, the first integrated circuit die operates as a primary integrated circuit die and the second integrated circuit die operates as a secondary integrated circuit die and in a second mode of the plurality of modes, the second integrated circuit die operates as a primary integrated circuit die and the first integrated circuit die operates as a secondary integrated circuit die. The system may be further characterized by the first integrated circuit die and the second integrated circuit die being incorporated in an integrated circuit package.

Also described is a method of operating an information processing system. The method includes providing power to a first integrated circuit die, the first integrated circuit die comprising a first system interconnect, the first system interconnect including a first plurality of master ports and a first plurality of slave ports, the first system interconnect operable as per a first system interconnect protocol, a first processor core communicatively coupled to a first master port of the first plurality of master ports, and a first slave circuit communicatively coupled to a first slave port of the first plurality of slave ports. The method further includes providing power to a second integrated circuit die, the second integrated circuit die including a second system interconnect that includes a second plurality of master ports and a second plurality of slave ports, the second system interconnect operable as per the first system interconnect protocol, a second processor core communicatively coupled to a first master port of the second plurality of master ports, an addressable slave circuit communicatively coupled to a first slave port of the second plurality of slave ports, the addressable slave circuit having an addressable range of addresses, the addressable range of addresses corresponding to a first address range within an address map of the first integrated circuit die, the addressable range of addresses corresponding to a second address range within an address map of the second integrated circuit die, and a first master circuit communicatively coupled to a second master port of the second plurality of master ports. The method further includes performing a data access to the addressable slave circuit by a system interconnect master circuit of the first system interconnect of the first integrated circuit die, the data access being performed via the first system interconnect, the first slave circuit, the first master circuit, and the second system interconnect. The method may further comprise providing a first address of the data access within the first address range by the system interconnect master circuit on the first system interconnect, receiving the first address from the first system interconnect by the first slave circuit, translating the first address from the first address range to the second address range to produce a translated address, providing the translated address on the second system interconnect by the first master circuit, and receiving the translated address by the addressable slave circuit from the second system interconnect. The method may be further characterized by the translating being performed by the first master circuit. The method may be further characterized by the translating being performed by the first slave circuit. The method may further include performing a data access to the addressable slave circuit by a system interconnect master circuit of the first system interconnect of the first integrated circuit die, the data access being performed via the first system interconnect, the first slave circuit, the first master circuit, and the second system interconnect, wherein the performing a data access further includes providing a first address by the system interconnect master circuit on the first system interconnect, the first address being an address within an address range of a second slave circuit communicatively coupled to a second slave port of the first plurality of slave ports of the first system interconnect, receiving the data access from the first system interconnect by the first slave circuit and wherein the second slave circuit does not receive the data access, providing the data access to the first master circuit from the first slave circuit, providing the data access to the second system interconnect by the first master circuit, and receiving the data access by the addressable slave circuit from the second system interconnect. The method may further comprise performing a data access to the addressable slave circuit by a system interconnect master circuit of the first system interconnect of the first integrated circuit die, the data access being performed via the first system interconnect, the first slave circuit, the first master circuit, and the second system interconnect, wherein the performing a data access further includes providing a first address by the system interconnect master circuit on the first system interconnect, the first address being an address within an address range of a second slave circuit communicatively coupled to a second slave port of the first plurality of slave ports of the first system interconnect, receiving the data access from the first system interconnect by the first slave circuit and wherein the second slave circuit does not receive the data access, providing the data access to the first master circuit from the first slave circuit, providing the data access to the second system interconnect by the first master circuit, and receiving the data access by the addressable slave circuit from the second system interconnect. The method may further comprise inhibiting operation of the second processor core during the performing a data access.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, crossbar was pointed as an example of a system interconnect, another type of system interconnect may be used. Also the core of the secondary die was described as being power down. Powering down does not necessarily removing all power but may be something less such as simply stopping the clock to the core or selectively removing power from some portion of the core. Other examples of reducing power consumption of the core may also be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:
1. An information processing system, comprising:
  a first integrated circuit die comprising:
    a first system interconnect, the first system interconnect including a first plurality of master ports and a first plurality of slave ports, the first system interconnect operable as per a first system interconnect protocol;
    a first processor core communicatively coupled to a first master port of the first plurality of master ports;
    a memory communicatively coupled to a first slave port of the first plurality of slave ports; and a first slave circuit communicatively coupled to a second slave port of the first plurality of slave ports; and a second integrated circuit die, the second integrated circuit die comprising:

a second system interconnect, the second system interconnect including a second plurality of master ports and a second plurality of slave ports, the second system interconnect operable as per the first system interconnect protocol;

a second processor core communicatively coupled to a first master port of the second plurality of master ports;

an addressable slave circuit communicatively coupled to a first slave port of the second plurality of slave ports, the addressable slave circuit having an addressable range of addresses, the addressable range of addresses corresponding to a first address range within an address map of the first integrated circuit die, the addressable range of addresses corresponding to a second address range within an address map of the second integrated circuit die; and a first master circuit communicatively coupled to a second master port of the second plurality of master ports;

wherein the first slave circuit is communicatively coupled to the first master circuit for providing data during a data access to the addressable slave circuit by a system interconnect master of the first integrated circuit die via the first system interconnect and the second system interconnect.

2. The system of claim 1 wherein at least one of the first slave circuit and the first master circuit includes an address translation circuit for translating an address of the addressable slave circuit from the first address range to the second address range.

3. The system of claim 1 wherein the first master circuit includes a translation circuit.

4. The system of claim 1 further comprising:

a memory configured to store configuration information, wherein the configuration information is utilized for controlling the system to operate in one of a plurality of modes, wherein:

in a first mode of the plurality of modes, data accesses to the addressable slave circuit are made by a system interconnect master of the first system interconnect addressing the first address range; and in a second operating mode, data accesses to the addressable slave circuit are made by a system interconnect master of the first system interconnect addressing a third address range of the address map of the first integrated circuit die.

5. The system of claim 4 wherein the addressable slave circuit is a memory circuit.

6. The system of claim 1 further comprising:

a configuration communication path between the first integrated circuit die and the second integrated circuit die, the configuration communication path for providing operating mode information between the first integrated circuit die and the second integrated circuit die.

7. The system of claim 1 wherein the addressable slave circuit is a memory circuit.

8. The system of claim 1 wherein the addressable slave circuit is a peripheral circuit.

9. The system of claim 1 wherein during at least one mode of operation, the second core is in a low power mode during data accesses to the addressable slave circuit.

10. The system of claim 1 wherein the first integrated circuit die is characterized as a microcontroller and the second integrated circuit die is characterized as a microcontroller.

11. The system of claim 1 wherein:

the first integrated circuit die further comprises:

a second master circuit communicatively coupled to a second master port of the first plurality of master ports, the second master circuit is coupled to external terminals of the first integrated circuit die, wherein the external terminals are configured in a non-useable state;

the second integrated circuit die further comprises:

a second slave circuit communicatively coupled to a second slave port of the second plurality of slave ports, the second slave circuit is coupled to external terminals of the second integrated circuit die, the external terminals of the second integrated circuit die are configured in a non usable state; and at least one of the second slave circuit and the second master circuit includes an address translation circuit for translating an address.

12. The system of claim 1 further comprising:

a memory configured to store configuration information, wherein the configuration information is utilized for controlling the system to operate in one of a plurality of modes, wherein:

in a first mode of the plurality of modes, the first integrated circuit die operates as a primary integrated circuit die and the second integrated circuit die operates as a secondary integrated circuit die; and in a second mode of the plurality of modes, the second integrated circuit die operates as a primary integrated circuit die and the first integrated circuit die operates as a secondary integrated circuit die.

13. The system of claim 1 wherein the first integrated circuit die and the second integrated circuit die are incorporated in an integrated circuit package.

14. A method of operating an information processing system, the method comprising:

providing power to a first integrated circuit die, the first integrated circuit die comprising:

a first system interconnect, the first system interconnect including a first plurality of master ports and a first plurality of slave ports, the first system interconnect operable as per a first system interconnect protocol;

a first processor core communicatively coupled to a first master port of the first plurality of master ports; and a first slave circuit communicatively coupled to a first slave port of the first plurality of slave ports;

providing power to a second integrated circuit die, the second integrated circuit die comprising:

a second system interconnect, the second system interconnect including a second plurality of master ports and a second plurality of slave ports, the second system interconnect operable as per the first system interconnect protocol;

a second processor core communicatively coupled to a first master port of the second plurality of master ports;

an addressable slave circuit communicatively coupled to a first slave port of the second plurality of slave ports, the addressable slave circuit having an addressable range of addresses, the addressable range of addresses corresponding to a first address range within an address map of the first integrated circuit die, the addressable range of addresses corresponding to a second address range within an address map of the second integrated circuit die; and a first master circuit communicatively coupled to a second master port of the second plurality of master ports; and performing a data access to the addressable slave circuit by a system interconnect master circuit of the first system interconnect of the first integrated circuit die, the data access being performed via the first system interconnect, the first slave circuit, the first master circuit, and the second system interconnect.

15. The method of claim 14 wherein the performing a data access further comprises:

providing a first address of the data access within the first address range by the system interconnect master circuit on the first system interconnect;

receiving the first address from the first system interconnect by the first slave circuit;

translating the first address from the first address range to the second address range to produce a translated address;

providing the translated address on the second system interconnect by the first master circuit; and receiving the translated address by the addressable slave circuit from the second system interconnect.

16. The method of claim 15 wherein the translating is performed by the first master circuit.

17. The method of claim 15 wherein the translating is performed by the first slave circuit.

18. The method of claim 15 further comprising:

performing a data access to the addressable slave circuit by a system interconnect master circuit of the first system interconnect of the first integrated circuit die, the data access being performed via the first system interconnect, the first slave circuit, the first master circuit, and the second system interconnect, wherein the performing a data access further includes:

providing a first address by the system interconnect master circuit on the first system interconnect, the first address being an address within an address range of a second slave circuit communicatively coupled to a second slave port of the first plurality of slave ports of the first system interconnect;

receiving the data access from the first system interconnect by the first slave circuit and wherein the second slave circuit does not receive the data access;

providing the data access to the first master circuit from the first slave circuit;

providing the data access to the second system interconnect by the first master circuit; and receiving the data access by the addressable slave circuit from the second system interconnect.

19. The method of claim 15 further comprising:

performing a data access to the addressable slave circuit by a system interconnect master circuit of the first system interconnect of the first integrated circuit die, the data access being performed via the first system interconnect, the first slave circuit, the first master circuit, and the second system interconnect, wherein the performing a data access further includes:

providing a first address by the system interconnect master circuit on the first system interconnect, the first address being an address within an address range of a second slave circuit communicatively coupled to a second slave port of the first plurality of slave ports of the first system interconnect;

receiving the data access from the first system interconnect by the first slave circuit and wherein the second slave circuit does not receive the data access;

providing the data access to the first master circuit from the first slave circuit;

providing the data access to the second system interconnect by the first master circuit; and receiving the data access by the addressable slave circuit from the second system interconnect.

20. The method of claim 14 further comprising:

inhibiting operation of the second processor core during the performing a data access.

\* \* \* \* \*